United States Patent
Hahn et al.

(10) Patent No.: US 8,785,767 B2
(45) Date of Patent: Jul. 22, 2014

(54) METHOD FOR FIXING A PHOTOVOLTAIC CELL CONNECTOR ON A SURFACE OF A PHOTOVOLTAIC CELL, PHOTOVOLTAIC CELL CONNECTOR FORMING DIE, DEVICE FOR FIXING A PHOTOVOLTAIC CELL CONNECTOR ON A SURFACE OF A PHOTOVOLTAIC CELL

(75) Inventors: Harald Hahn, Dresden (DE); Olaf Storbeck, Dresden (DE)

(73) Assignee: SolarWorld Innovations GmbH, Freiberg (DE)

( * ) Notice: Subject to any disclaimer, the term of this patent is extended or adjusted under 35 U.S.C. 154(b) by 247 days.

(21) Appl. No.: 13/099,417

(22) Filed: May 3, 2011

(65) Prior Publication Data

US 2011/0271996 A1    Nov. 10, 2011

(30) Foreign Application Priority Data

May 4, 2010    (DE) .......................... 10 2010 016 771

(51) Int. Cl.
*H01L 31/05*    (2014.01)

(52) U.S. Cl.
USPC ....................................................... 136/256

(58) Field of Classification Search
CPC . H01L 31/05; H01L 31/18; H01L 31/035281; H01L 31/0236; H01L 31/02363; H01L 2224/48091; H01L 2224/73265; H01L 2224/83; H01L 2224/85; H01L 2224/4807; H01L 2224/48453; H01L 27/14636; H01L 21/2007; H01L 24/02; H01L 24/85; H01L 24/03; H01L 2251/105; H05K 13/04

USPC ......... 136/206, 207, 210, 214, 218, 221, 244, 136/246, 252, 256, 259

See application file for complete search history.

(56) References Cited

U.S. PATENT DOCUMENTS

| 5,110,370 A | 5/1992 | Vogeli et al. |
|---|---|---|
| 2004/0099974 A1 | 5/2004 | Yang |
| 2007/0125415 A1 | 6/2007 | Sachs |
| 2009/0025782 A1* | 1/2009 | Ojima et al. .................. 136/255 |
| 2010/0246191 A1* | 9/2010 | Ogawa et al. ................. 362/309 |

FOREIGN PATENT DOCUMENTS

| DE | 69120278 T2 | 12/1996 |
|---|---|---|
| DE | 19804877 A1 | 8/1999 |
| KR | 20040045261 A | 6/2004 |
| WO | 2007067304 A2 | 6/2007 |
| WO | 2009126745 A2 | 10/2009 |

OTHER PUBLICATIONS

English abstract of DE 19804877 A1, Publication date: Aug. 12, 1999.

* cited by examiner

*Primary Examiner* — Susan D Leong

(57) ABSTRACT

In various embodiments, a method for patterning the surface of a solder-covered photovoltaic cell connector on the light-incidence side of a photovoltaic cell is provided. The method may include heating at least a part of the solder-covered photovoltaic cell connector which is in contact with the surface of the photovoltaic cell; patterning at least a part of the surface of the heated part of the solder-covered photovoltaic cell connector so that a predetermined surface pattern is formed; and cooling the photovoltaic cell connector by means of which the pattern is fixed on the solder-covered surface of the photovoltaic cell connector.

7 Claims, 11 Drawing Sheets

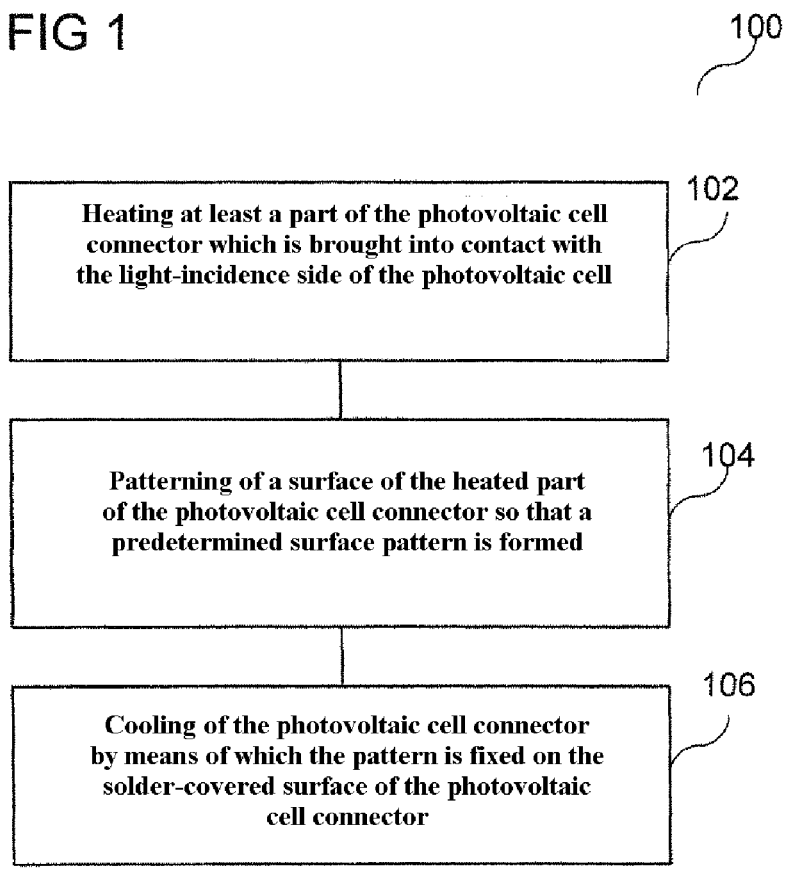

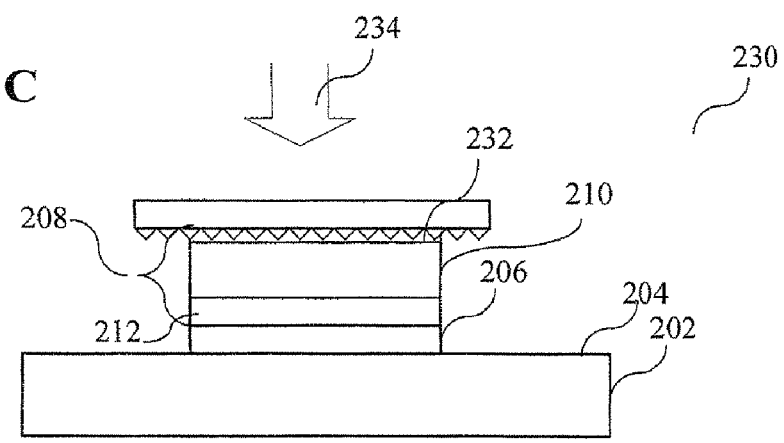
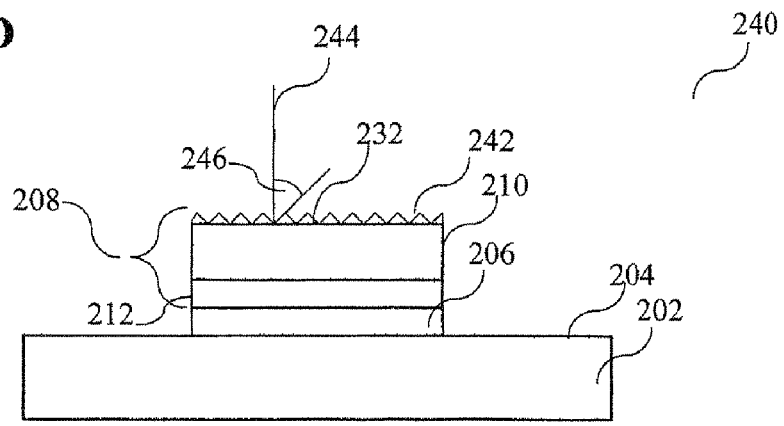

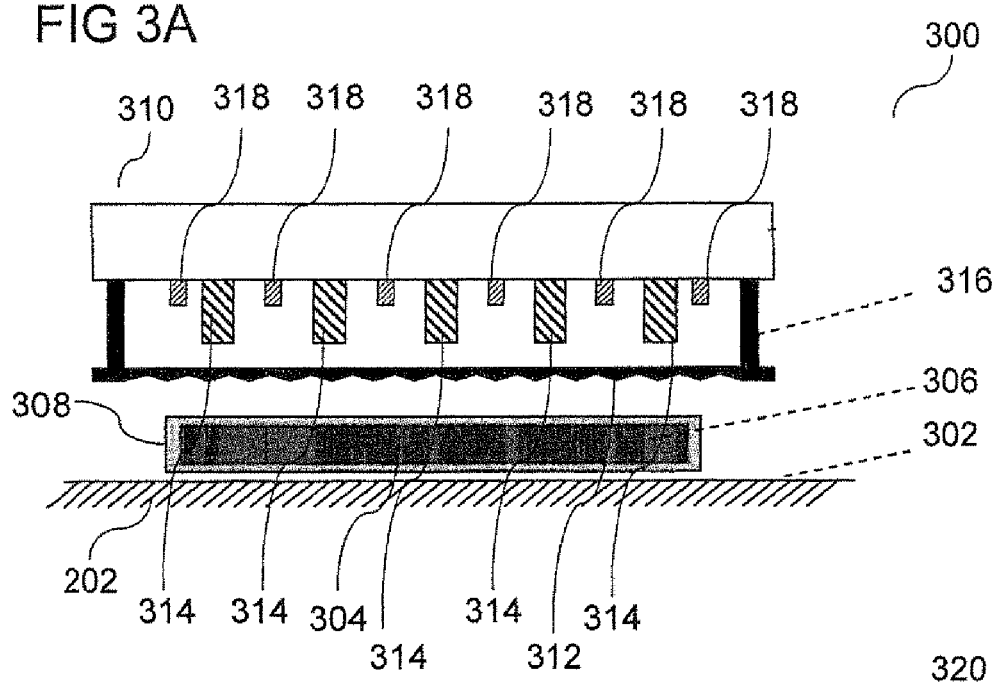
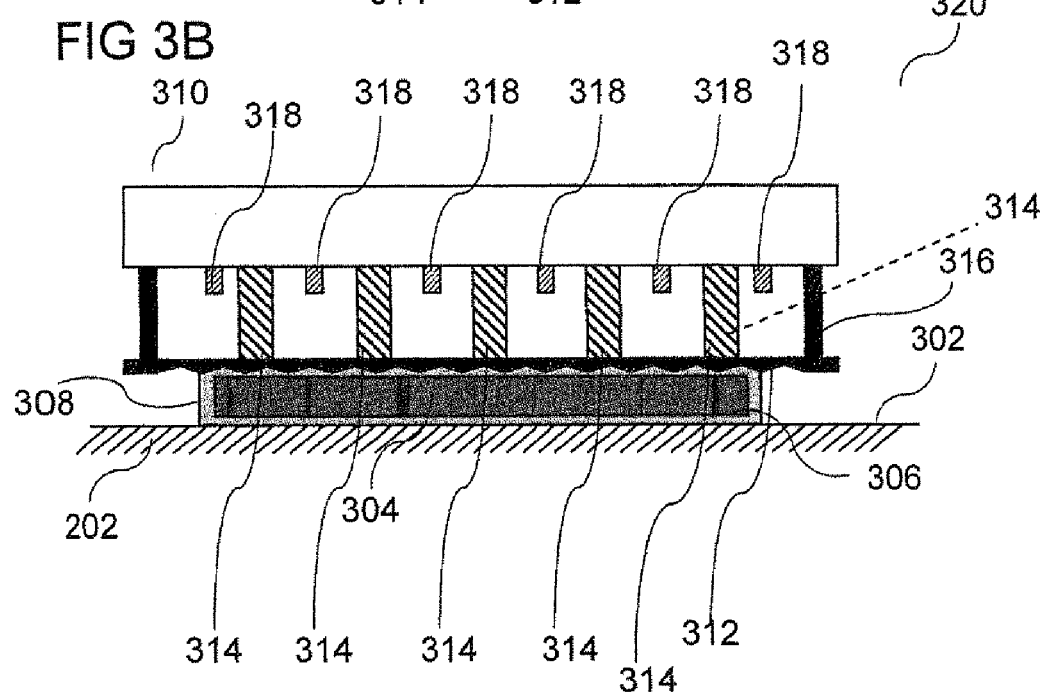

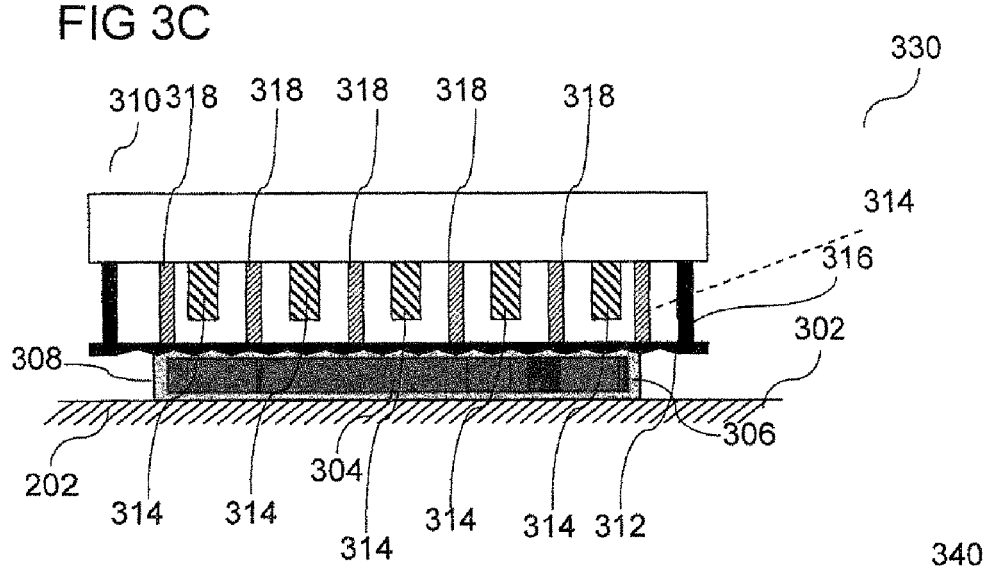
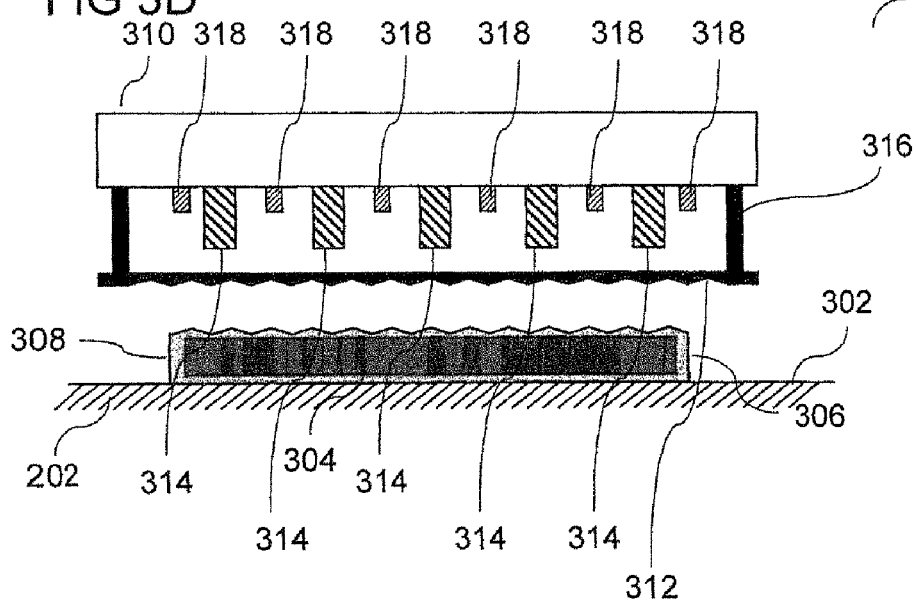

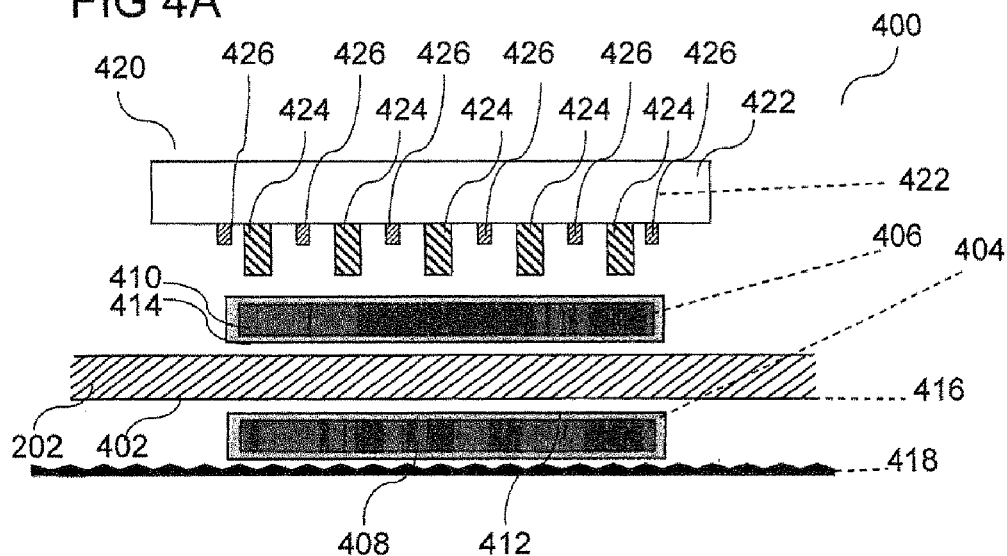
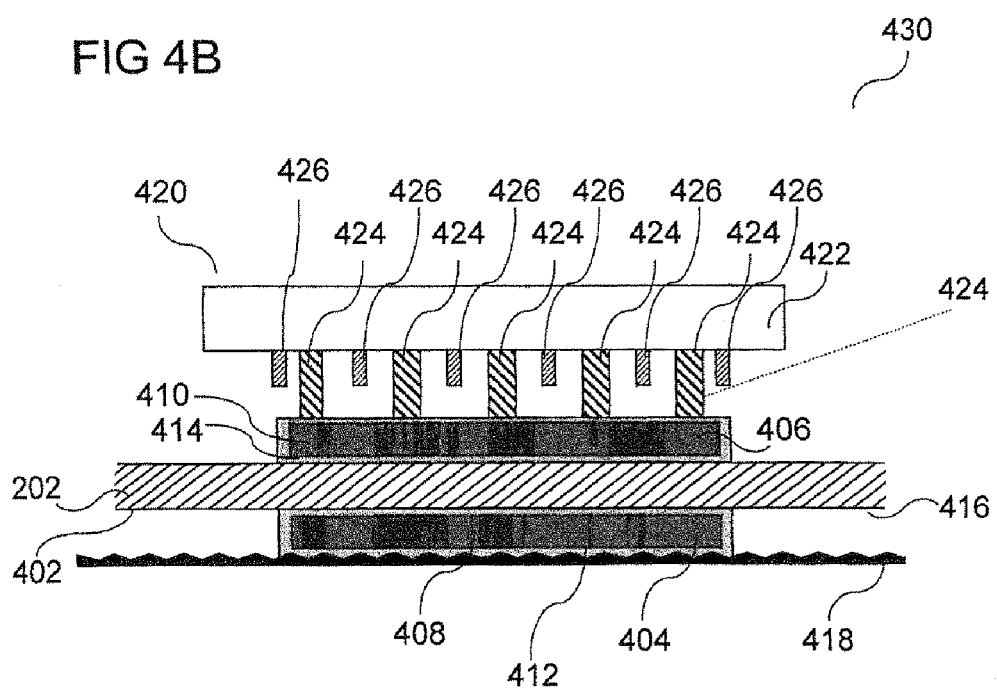

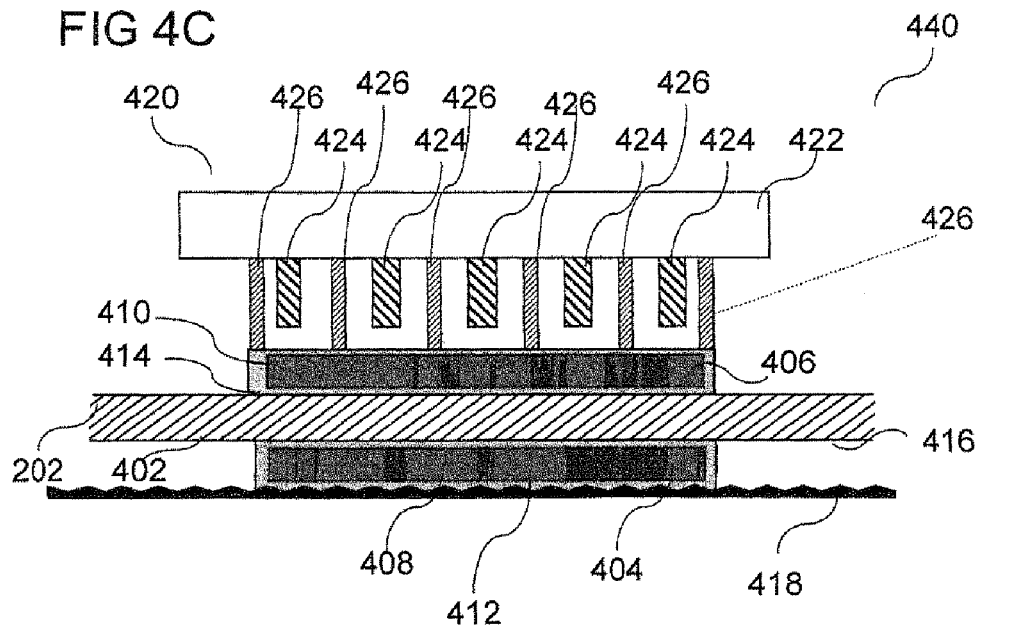
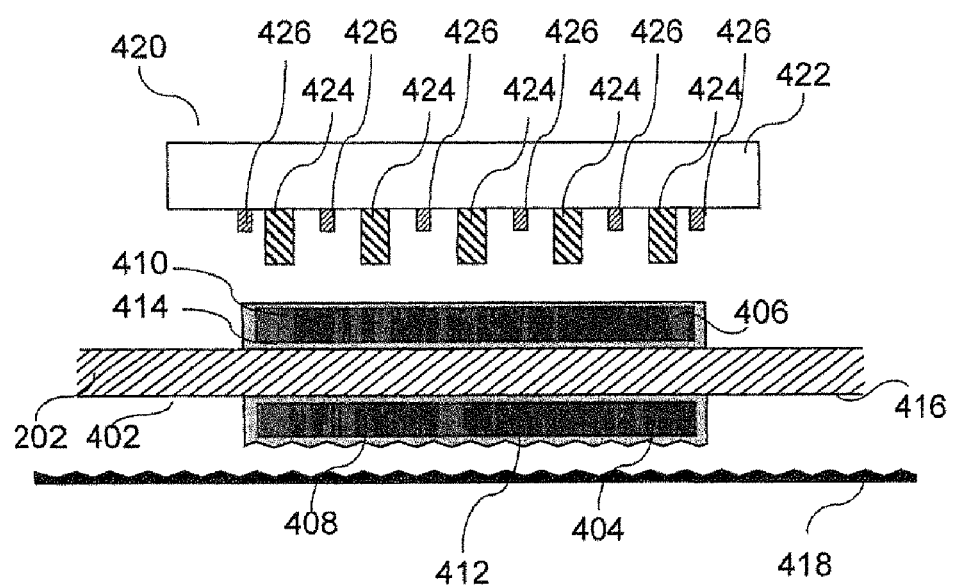

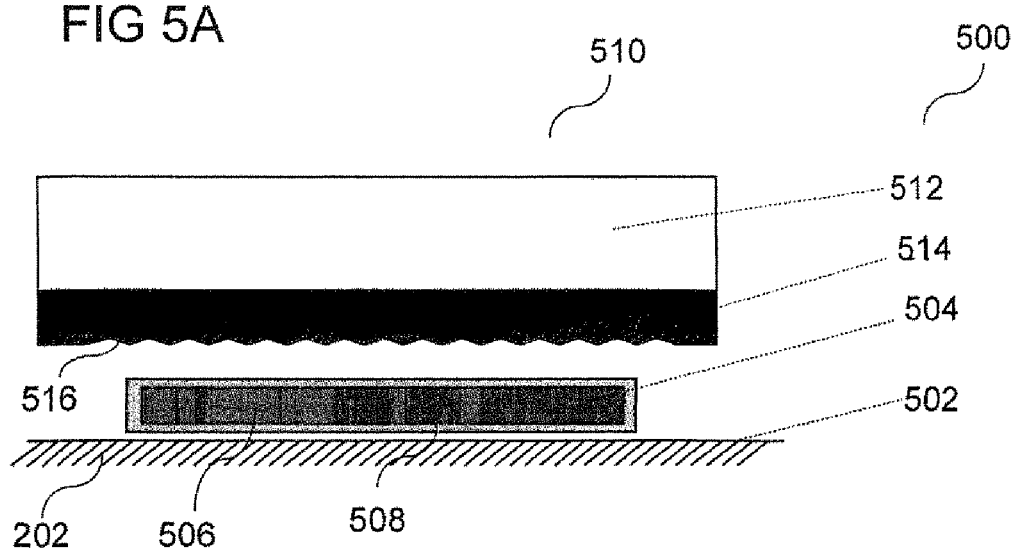
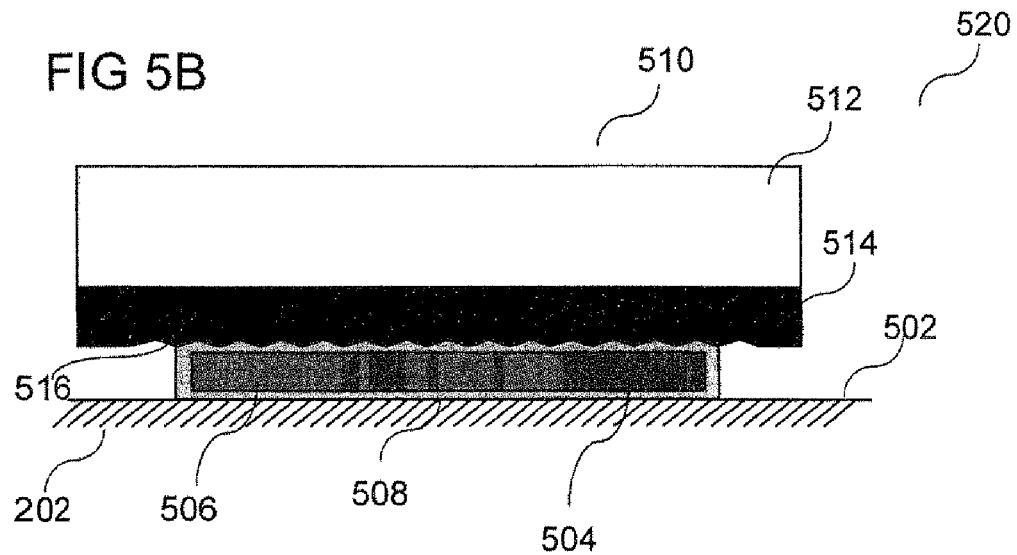

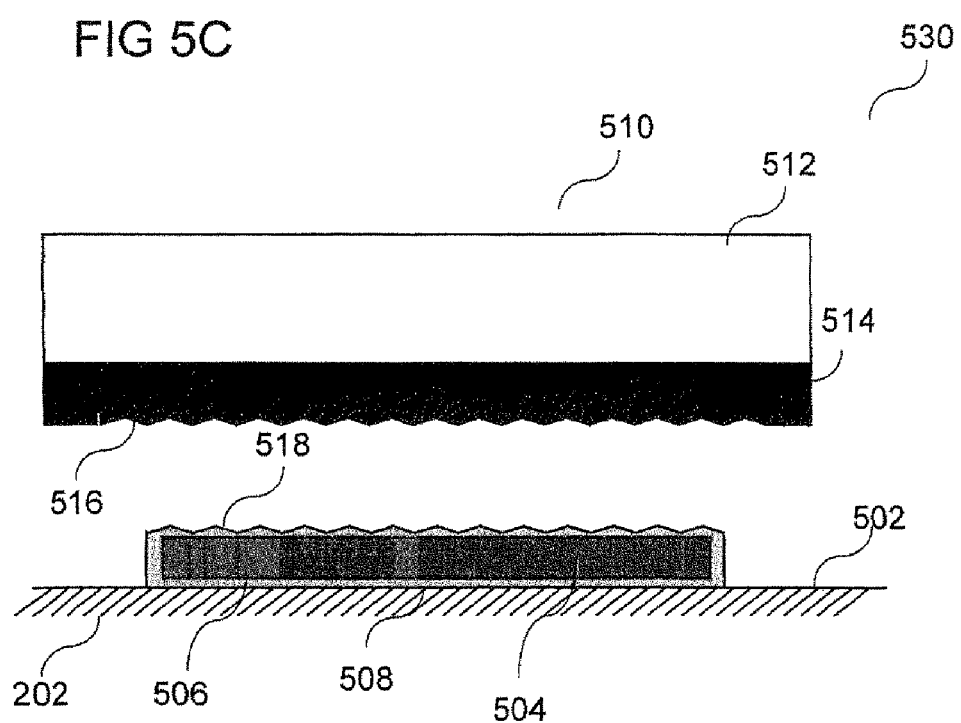

METHOD FOR FIXING A PHOTOVOLTAIC CELL CONNECTOR ON A SURFACE OF A PHOTOVOLTAIC CELL, PHOTOVOLTAIC CELL CONNECTOR FORMING DIE, DEVICE FOR FIXING A PHOTOVOLTAIC CELL CONNECTOR ON A SURFACE OF A PHOTOVOLTAIC CELL

CROSS-REFERENCE TO RELATED APPLICATION

This application claims priority to German Patent Application Serial No. 10 2010 016 771.1, which was filed May 4, 2010, and is incorporated herein by reference in its entirety.

TECHNICAL FIELD

Various embodiments relate to methods for fixing a photovoltaic cell connector on a surface of a photovoltaic cell, a photovoltaic cell connector forming die, and a device for fixing a photovoltaic cell connector on a surface of a photovoltaic cell.

BACKGROUND

In a conventional solar module, approximately 3% of the usable solar cell surface is shaded by the so-called cell connectors. To reduce these losses, various cell concepts have been worked out which shift the electric contact arrangement of the cells to the unilluminated rear. If it is possible to feed the light reflected from the frontal solder connections back to the active cell area, such complex and costly cell concepts could be bypassed.

One possibility of recapturing the light reflected at the so-called soldering strips consists in using suitably patterned soldering strips (as described in WO 2007/067304 A2). By impressing a trench pattern into the soldering strip, impinging light is reflected at an ideally very flat angle. If the electrically contacted solar cells are encapsulated in a solar module, e.g. in an EVA matrix and glass on the sun side, light reflected at a shallow angle from the pattern of the cell connectors can be conducted back into the module due to the total reflection at the transition from glass to air. A comparable solution is provided, e.g. by the LMS technology from Schlenk. The disadvantages in this case are that the soldering strips must be impressed on both sides and the copper surface does not include very high reflection. For this purpose, a thin layer of a well-reflecting material, usually silver, is applied. The solder must therefore be applied to the solar cell in a separate step in the form of a soldering paste and there is a risk that during the soldering, solder passes around the strip and fills parts of the pattern up again.

Furthermore, cell connectors patterned in this manner are clearly more expensive than conventional cell connectors so that approximately 50% of the commercial benefits are consumed by increases in material costs. As well, these cell connectors cannot be soldered conventionally since both sides of the cell connector must be coated for this. There is also a risk that the light trap patterns are covered with solder and thus become inactive. The price of such strips is also approximately twice or three times as high compared with the price of other conventional cell connectors.

SUMMARY

In various embodiments, a method for patterning the surface of a solder-covered photovoltaic cell connector on the light-incidence side of a photovoltaic cell is provided. The method may include heating at least a part of the solder-covered photovoltaic cell connector which is in contact with the surface of the photovoltaic cell; patterning at least a part of the surface of the heated part of the solder-covered photovoltaic cell connector so that a predetermined surface pattern is formed; and cooling the photovoltaic cell connector by means of which the pattern is fixed on the solder-covered surface of the photovoltaic cell connector.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 a flow chart in which a method for fixing a photovoltaic cell connector on a surface of a photovoltaic cell according to one embodiment is shown;

FIGS. 2A to 2E show the impressing of the desired surface pattern into a cell connector (for example a wire) according to one embodiment;

FIGS. 3A to 3D show the impressing of the desired surface pattern into a cell connector (for example a wire) according to one embodiment;

FIGS. 4A to 4D show the impressing of the desired surface pattern into a cell connector (for example a wire) according to one embodiment;

FIGS. 5A to 5C show the impressing of the desired surface pattern into a cell connector (for example a wire) according to one embodiment.

DETAILED DESCRIPTION

Figure 2A:
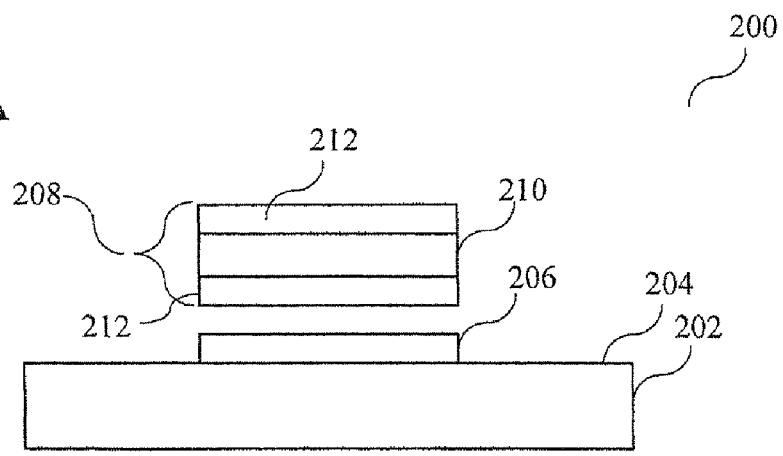

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the attached drawings which form a part of it and in which specific embodiments, in which the invention can be exercized, are shown for the purpose of illustration. In this respect, directional terminology such as "top", "bottom", "front", "rear", "frontal", "rear", etc. are used with respect to the orientation of the figure(s) described. Since components of embodiments can be positioned in a number of different orientations, the directional terminology is used for illustration and is in no way restrictive. Naturally, other embodiments can be used and structural or logical changes can be performed without deviating from the range of protection of the present invention. Naturally, the features of the various embodiments described herein can be combined with one another unless specifically specified differently. The following detailed description should therefore not be considered to be restrictive and the range of protection of the present invention is defined by the attached claims.

Within the context of this description, the terms "joined", "connected" and "coupled" are used for describing both a direct and an indirect joint, a direct or indirect connection and a direct or indirect coupling. Identical or similar elements in the figures are provided with identical reference symbols as far as this is appropriate.

The embodiments described in the text which follows provide methods and instruments, devices or facilities with the aid of which the solder layer present on components to be connected can be directly patterned suitably during the soldering process. The result of this patterning is to impart an additional functionality to the solder layer beyond the pure linking of the components. It is the subject matter of various embodiments to transfer the pattern of the matrix (generally a forming die) to the solder layer by impressing a suitably patterned component (negative) into, for example excessive, molten solder not used for forming the connection.

Descriptively, generation of a light-collecting surface on the photovoltaic cell connector in a photovoltaic module is provided in various embodiments.

In contrast to the conventional cell connector described above, it is not the cell connector but the solder layer applied to a commercial cell connector which is patterned in various embodiments. In various embodiments, this is only patterned during the soldering.

Various embodiments provide methods for fixing a photovoltaic cell connector on a surface of a photovoltaic cell, a photovoltaic cell connector forming die and a device for fixing a photovoltaic cell connector on a surface of a photovoltaic cell, achieving a more cost-effective production of a photovoltaic cell with surface-patterned photovoltaic cell connectors.

According to various embodiments, a method for fixing a photovoltaic cell connector on a surface of a photovoltaic cell is provided. The method may include bringing the photovoltaic cell connector into contact with the surface of the photovoltaic cell; heating at least a part of the photovoltaic cell connector which is brought into contact with the surface of the photovoltaic cell; patterning a surface of the heated part of the photovoltaic cell connector so that a predetermined surface pattern is formed; and cooling the photovoltaic cell connector by means of which the photovoltaic cell connector is fixed to the surface of the photovoltaic cell.

Due to the heating and softening and possibly partial or complete melting of at least a part (for example a surface area) of the photovoltaic cell connector and the impressing of the desired surface pattern therein, a very cost-effective and efficient solution is created for providing a surface pattern in the photovoltaic cell connector, for example with a surface pattern reflecting the light reflected from the surface of the photovoltaic cell connector back to the emitter surface of the photovoltaic cell (for example at the total reflection angle of the glass/air interface).

In this manner, the efficiency of a photovoltaic cell remains high, according to various embodiments, and the production of such a photovoltaic cell is cost-effective and simple.

According to one embodiment, the patterning can take place by means of a forming die which is impressed into the at least one part of the photovoltaic cell connector. In this manner, a simple mechanism for producing the desired surface pattern is created.

According to one embodiment, the forming die can be impressed into the at least one part of the photovoltaic cell connector whilst the at least one part of the photovoltaic cell connector is cooling. In this manner, the desired impressed surface pattern is impressed reliably, accurately and durably into the surface of the photovoltaic cell connector.

In various embodiments, the photovoltaic cell is a solar cell.

In various embodiments, a photovoltaic cell is understood to be a device which converts light energy (light within the visible range of wavelengths of approximately 300 nm up to approximately 1150 nm, for example sunlight, in the case of a solar cell as an example of a crystalline silicon photovoltaic cell) directly into electrical energy by means of the so-called photovoltaic effect.

The surface of the photovoltaic cell may be the surface of the photovoltaic cell on the emitter side.

Furthermore, the surface of the photovoltaic cell may include electrically conductive patterns (also called metallization patterns or metallization lines, for example metallization fingers) by means of which the photovoltaic cell connector is fixed.

According to one embodiment, the electrically conductive patterns may be metallization lines which are applied to the surface of the photovoltaic cell.

The photovoltaic cell connector may include solder material which is molten when heated. In various embodiments, the photovoltaic cell connector can have a metal pattern on which the solder material is applied at least partially. For example, the photovoltaic cell connector includes a metal core which is surrounded by the solder material at least partially.

According to one embodiment, the patterning of the surface of the heated part of the photovoltaic cell connector may include impressing the surface of the heated part of the photovoltaic cell connector.

The patterning of the surface of the heated part of the photovoltaic cell connector may also include impressing the surface of the heated part of the solder material of the photovoltaic cell connector.

According to one development, the surface of the photovoltaic cell connector can be patterned in such a manner that incident light is reflected from the surface of the photovoltaic cell connector especially in such a manner that this leads to a total reflection at the glass/air interface of the photovoltaic module.

According to one development, the predetermined surface pattern can be arranged in such a manner that a predetermined light dispersion in all directions of light radiated onto the surface of the photovoltaic cell connector and/or of light reflected from the surface of the photovoltaic cell connector is provided.

According to one development, the predetermined surface pattern can be arranged in such a manner that essentially a total reflection of light reflected from the surface of the photovoltaic cell connector at the glass/air interface of the photovoltaic module is provided.

According to one development, the predetermined surface pattern can be arranged in such a manner as is described in various examples in WO 2007/067304 A2.

According to another embodiment, the patterning may be carried out by impressing a forming die into the surface of the heated part of the photovoltaic cell connector.

The forming die may include a forming pattern inverse to the predetermined surface pattern.

Furthermore, the layer thickness of the solder material forming a solder layer can be at least so great that the inverse forming pattern of the forming die is completely accommodated by the solder layer.

According to another embodiment, the surface patterns can be larger than the wavelength of the light which may be converted into electrical current by the respective solar cell.

According to various embodiments, a photovoltaic cell connector forming die for impressing a predetermined surface pattern into a surface of a photovoltaic cell connector is provided. The photovoltaic cell connector forming die may include a heating element arranged for heating at least a part of the photovoltaic cell connector which is brought into contact with the surface of a photovoltaic cell; a forming element which includes a forming pattern for impressing the predetermined surface pattern into the surface of the photovoltaic cell connector; and a holding-down element arranged for holding down the forming element on the at least one part, heated by means of the heating element, of the photovoltaic cell connector.

According to one embodiment, the forming pattern can be arranged on a straight-line forming element and the forming element may be supported to be movable in the direction towards the surface of the photovoltaic cell connector.

According to one embodiment, the forming element can be supported to be movable in such a manner that it can be moved towards the surface of the photovoltaic cell connector and that it can be moved away from the surface of the photovoltaic cell connector.

According to one embodiment, the forming pattern may be arranged on the circumference of a roller-shaped and rotatable forming element and the forming element may be supported to be rollable along the surface of the photovoltaic cell connector.

According to various embodiments, a device for fixing a photovoltaic cell connector on a surface of a photovoltaic cell is provided. The device may include a positioning device for bringing the photovoltaic cell connector into contact with the surface of the photovoltaic cell a heater for heating at least a part of the photovoltaic cell connector which is brought into contact with the surface of the photovoltaic cell; a forming die which includes a forming pattern for impressing a predetermined surface pattern into the heated surface of the photovoltaic cell connector so that a predetermined surface pattern is formed; and a controller which is arranged in such a manner that it drives the heater and the forming die in such a manner that the forming die is held at least partially in contact with the surface of the photovoltaic cell connector during the cooling of the photovoltaic cell connector so that the forming pattern is impressed into the surface of the photovoltaic cell connector by means of which the photovoltaic cell connector is fixed to the surface of the photovoltaic cell.

According to various embodiments, a method for fixing a photovoltaic cell connector on a surface of a photovoltaic cell is also provided. The method may include providing a photovoltaic cell connector; placing a photovoltaic cell onto the photovoltaic cell connector, wherein, e.g. the rear of the photovoltaic cell is placed onto the photovoltaic cell connector; placing a further photovoltaic cell connector onto the surface of the photovoltaic cell at the emitter side; heating at least one part of the two photovoltaic cell connectors, which are brought into contact both with the surface of the photovoltaic cell at the emitter side and its rear; and cooling the photovoltaic cell connector, by means of which a photovoltaic cell connector is fixed to the surface at the emitter side and a further photovoltaic cell connector is fixed to the rear of the photovoltaic cell.

According to one embodiment of the method, the method may include patterning of a surface of the heated part of the photovoltaic cell connector so that a predetermined surface pattern is formed.

It must be noted that the features of the various embodiments and embodiments described can be combined arbitrarily with one another in as much as this is meaningful and desired.

In various embodiments, the solder lying on top (with respect to the surface of the photovoltaic cell onto which the cell connector is placed) is patterned with a corresponding holding-down device during the soldering. This holding-down device carries, for example, the negative of the desired pattern and includes, for example on its surface, a material which is not solderable itself, e.g. $Al_2O_3$ or $SiO_2$. During the soldering, the liquid solder fills the cavities and solidifies in the desired pattern. Since both sides of the photovoltaic cell connector can be identical at the output end, each side can be patterned depending on requirement.

In various embodiments, photovoltaic cells (for example solar cells) which, for example, are formed in or on a wafer, can be electrically connected to one another and encapsulated, for example, as one photovoltaic module (e.g. solar module). A photovoltaic module may include a glass layer on its front (i.e. the sun side, also called emitter side) which makes it possible for light impinging on the photovoltaic module to pass the glass layer whilst the semiconductor wafer or wafers is or are protected at the same time, for example from rain, hail, snow, etc.

In various embodiments, a photovoltaic cell is provided. In various embodiments, the photovoltaic cell may include at least one photovoltaic layer. The at least one photovoltaic layer may include or consist of a semiconductor material (such as, for example, silicon), a compound semiconductor material (such as, for example, a III-V compound semiconductor material such as, for example, GaAs), a II-VI compound semiconductor material (such as, for example, CdTe) or a I-III-V compound semiconductor material (such as, for example, $CuInS_2$). In various embodiments, the at least one photovoltaic layer may include or consist of an organic material. In various embodiments, the silicon may include or consist of monocrystalline silicon, polycrystalline silicon, amorphous silicon and/or microcrystalline silicon. The at least one photovoltaic layer may include or consist of a junction pattern such as, for example, a pn junction pattern, a pin junction pattern, a Schottky-like junction pattern and the like.

The rear of the photovoltaic cell may include a rear electrode. The rear electrode may include or consist of electrically conductive material, for example a metal such as, for example, one or more of the following metals: Cu, Al, Au, Pt, Ag, Pb, Sn, Fe, Ni, Co, Zn, Ti, Mo, W, and/or Bi. The rear electrode may be optionally transparent. In various embodiments, the rear electrode may be patterned.

Furthermore, an electric contacting pattern, for example implemented in the form of a plurality of metallization lines, in other words metallization conductors (for example in the form of contact fingers) may be provided on or above the front surface (in other words the exposed surface) on the at least one photovoltaic layer. The metallization lines may extend essentially in parallel with one another and/or at a distance from one another. However, it should be noted that the metallization lines, as an alternative, extend at an angle from one another, however they do not intersect or touch along their extent. In various embodiments, the metallization lines may be provided in a comb pattern with a plurality of metal fingers which essentially extend in parallel with one another. In one implementation, the metallization lines are strip-shaped electrically conductive surface areas. In alternative embodiments, any other strip-shaped electrically conductive surface pattern may be provided.

In various embodiments, the photovoltaic cell may have the following dimensions: a width within a range of approximately 10 cm to approximately 50 cm, a length within a range of approximately 10 cm to approximately 50 cm, and a thickness within a range of approximately 200 μm to approximately 300 μm.

FIG. 1 shows a flow chart 100 in which a method for fixing a photovoltaic cell connector on a surface of a photovoltaic cell according to one embodiment is shown.

The method may include, in 102, heating of at least one part of the photovoltaic cell connector which is brought into contact with the light-incidence side of the photovoltaic cell, in 104, patterning of a surface of the heated part of the photovoltaic cell connector so that a predetermined surface pattern is formed, and, in 106, cooling of the photovoltaic cell connector by means of which the pattern is fixed on the solder-covered surface of the photovoltaic cell connector and the predetermined surface pattern is durably transferred to the photovoltaic cell connector.

Due to the heating and softening and possibly partial or complete melting of at least a part (for example a surface area) of the photovoltaic cell connector and the impressing of the desired surface pattern therein, a very cost-effective and efficient solution is created for providing a surface pattern in the photovoltaic cell connector, for example with a surface pattern reflecting the light reflected from the surface of the photovoltaic cell connector back to the emitter surface of the photovoltaic cell (for example at the total reflection angle of the glass/air interface).

In this manner, the efficiency of a photovoltaic cell remains high, according to various embodiments, and the production of such a photovoltaic cell is cost-effective and simple.

In various embodiments, the cell connector includes a respective solder layer, the solder material having a relatively low melting point in various embodiments, for example a melting point within a range of from 135° C. to approximately 250° C. (in the embodiment, in which the solder material is a soft solder). When conventional flux agents and soldering conditions are used, there is only a quite limited number of materials which it is possible to link to. There is therefore a large selection of thermally stable plastics such as PTFE or silicons, passivated metals (e.g. anodized Al) or also ceramics available as materials for the forming tool (which will be explained in greater detail still in the text which follows). To induce the heat, various soldering methods such as induction soldering or contact soldering can be used.

According to one embodiment, the patterning may thus take place by means of a forming die which is impressed into the at least one part of the photovoltaic cell connector. In this manner, a simple mechanism for producing the desired surface pattern is created.

FIG. 2A to FIG. 2D show the impressing of the desired surface pattern into a cell connector (for example a wire) according to one embodiment.

For example, FIG. 2A shows as explanation a photovoltaic cell 202 during its production at a first time in a first representation 200. In various embodiments, the surface 204 of the photovoltaic cell 202 includes electrically conductive patterns 206, for example metallization lines and/or so-called busbars (for example including or consisting of Ag) 206. Furthermore, a photovoltaic cell connector 208 is shown in cross section, the photovoltaic cell connector 208 including a metal core 210 which is surrounded, descriptively sheathed, by a solder layer 212 (for example of soft solder material). The photovoltaic cell connector 208 is brought into mechanical contact with at least a part of the electrically conductive patterns 206.

Figure 2B:
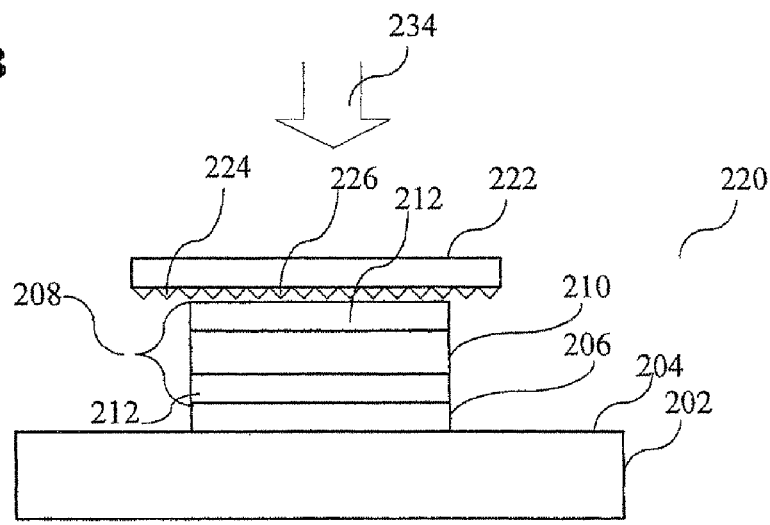

FIG. 2B shows the photovoltaic cell 202 during its production at a second time in a second representation 220.

In various embodiments, as shown in FIG. 2B, the photovoltaic cell 202, and thus the electrically conductive patterns 206, are heated and a forming die 222, for example in the form of a photovoltaic cell holding-down device 222 patterned on its holding underside 224 is pressed onto the photovoltaic cell connector 208 by means of which the photovoltaic cell connector 208 is mechanically fixed on the photovoltaic cell 202 and thus the electrically conductive patterns 206.

In various embodiments, the pattern 206 of the patterned underside of the forming die 222 may include a forming pattern inverse to a desired predetermined surface pattern to be achieved of the photovoltaic cell connector 208, for example the surface pattern of a part of the solder layer 212, as will be explained in greater detail still in the text which follows.

When the patterned underside of the forming die 222 is pressed into the heated and, for example, molten solder material of at least a part of the solder layer 212, as is shown in FIG. 2C in a third diagram 230, the pattern inverse to the pattern of the patterned underside of the forming die 222 is transferred, for example pressed, into at least a part of the solder layer 212 by means of which a patterned surface 232 of the solder layer 212 is formed.

The heat input for heating and, for example, melting at least a part of the solder layer 212 (for example of the area which is brought into contact with the underside of the forming die), is symbolized by means of an arrow 234 in FIG. 2B and FIG. 2C.

In various embodiments, the forming die is pressed into the heated solder layer 212, and thus the pattern of the patterned underside of the forming die 222 is transferred into the heated solder layer 212, until the solder layer 212 is again cooled sufficiently so that the solder material is again sufficiently solidified so that, when the forming die 222 is removed, the pattern impressed into the solder layer 212 is completely or essentially retained and does not dissolve again.

When the solder (in other words the solder material) has sufficiently cooled, the forming die 222 is then removed and a solder layer 242 patterned in the desired form remains as is shown in FIG. 2D in a fourth diagram 240. The surface pattern thus formed in the patterned solder layer 242 can be arranged in such a manner that a predetermined light dispersion of light radiated onto the surface of the photovoltaic cell connector is provided.

The surface pattern of the patterned solder layer 242 may be arranged in such a manner that a predetermined light dispersion in all directions of light radiated onto the surface of the photovoltaic cell connector is provided.

The surface pattern of the patterned solder layer 242 may be arranged in such a manner that essentially a total reflection of light reflected from the surface of the photovoltaic cell connector is provided at the glass/air interface of the photovoltaic module.

Figure 2E:
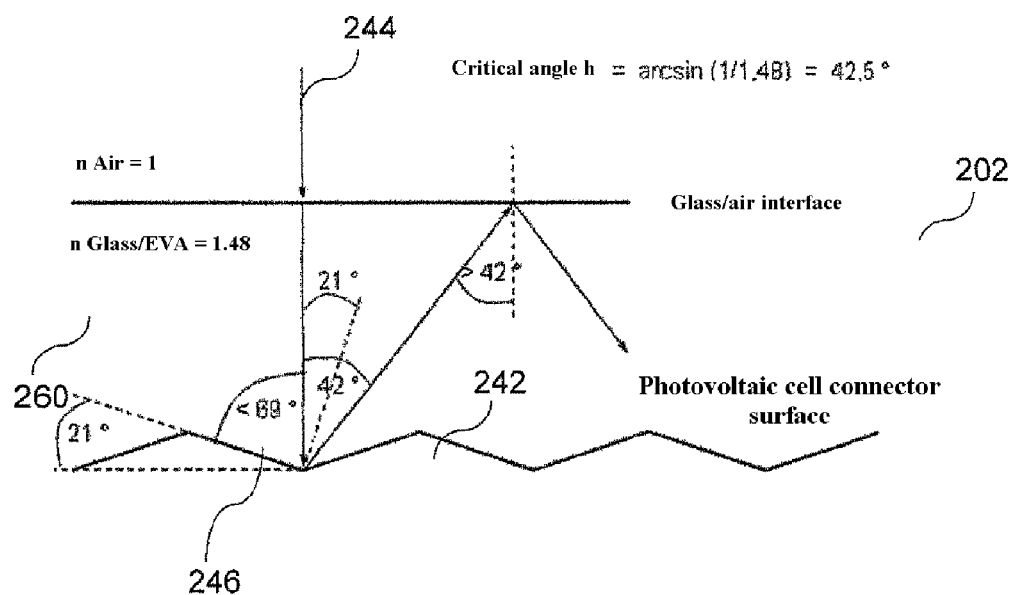

In general, the optimum pattern can be determined by using Snell's law. In various embodiments, the angle α 246 of the surface pattern of the patterned solder layer 242, e.g. corresponding to a glass/EVA embedding 260 of the photovoltaic cell 202, with an index of refraction of, e.g. 1.48 can be smaller than 69° inclined to the perpendicular 244 on the top surface of the metal core 210 as shown in FIG. 2E.

The layer thickness of the solder layer 212 to be patterned may be at least so great, at least in the area to be patterned, that the inverse forming pattern of the forming die 222 is completely accommodated by the solder layer 212. In various embodiments, the layer thickness of the solder layer 212 to be patterned can lie, at least in the area to be patterned, within a range of approximately 5 μm to approximately 100 μm, for example within a range of approximately 15 μm to approximately 25 μm, for example approximately 20 μm.

According to one embodiment, the surface pattern of the patterned solder layer 242 may be arranged in such a manner that it is greater than the wavelengths of the light which can be converted by the photovoltaic cell.

In various embodiments, an application in the field of photovoltaics is provided. In this case, the various embodiments may be used for impressing, for example, a suitable pattern into the well-reflecting solder layer of the photovoltaic cell connectors which are used for interconnecting the solar cells (generally the photovoltaic cells) in solar modules (generally the photovoltaic modules). The impressed pattern may be designed, e.g. as Lambert reflector or also in the form of V-trench patterns along the soldering strip. In this context, the pattern in the solder has the task of, after encapsulation of the interconnected cells in the solar modules (generally the photovoltaic modules), reflecting the greatest possible part of the impinging light at, for example, the total reflection angle of the phase boundary of the module with respect to the surrounding air back into the module and again supplying it for energy generation.

During the soldering of the photovoltaic cell connectors onto photovoltaic cells, holding-down devices are normally used which, after the melting of the solder, press the cell connector onto the cell until the solder has completely solidified. It is the subject matter of various embodiments to use a holding-down device extending, for example, over a part or over the entire length of the soldering strip as a forming die. The underside of the holding-down device carries the pattern to be impressed as a negative and transfers this pattern into the solder when it solidifies. In this arrangement, the dimensions of the pattern can be designed in such a manner that the thickness of the solder layer is sufficient for completely filling the patterns of the pressing mold. In various embodiments, the soldering can also take place by means of induction.

According to various embodiments, a photovoltaic cell connector forming die (for example implemented as holding-down device) is provided for impressing a predetermined surface pattern into a surface of a photovoltaic cell connector as will be explained in greater detail still in the text which follows. The photovoltaic cell connector forming die may include a heating element arranged for heating at least a part of the photovoltaic cell connector which is brought into contact with the surface of a photovoltaic cell; a forming element which includes a forming pattern for impressing the predetermined surface pattern into the surface of the photovoltaic cell connector; and a holding-down element arranged for holding the forming element down on the at least one part, heated by means of the heating element, of the photovoltaic cell connector.

According to one embodiment, the forming element may be supported to be movable in such a manner that it can be moved towards the surface of the photovoltaic cell connector and that it can be moved away from the surface of the photovoltaic cell connector.

FIGS. 3A to 3D show the impressing of the desired surface pattern into a cell connector according to one embodiment.

Descriptively, contact soldering by means of a patterned bow (for example produced from a plastic ribbon, an aluminum ribbon etc. having good thermal conductivity and low thermal capacity) is provided in this embodiment.

For example, FIG. 3A shows for the purpose of explanation a photovoltaic cell 202 during its electrical bonding at a first time in a first representation 300.

In various embodiments, the surface 302 of the photovoltaic cell 202 (for example the sun side) includes electrically conductive patterns (not shown in FIG. 3A), for example metallization lines and/or so-called busbars (for example including or consisting of Ag). Furthermore, a photovoltaic cell connector 306 is shown in cross section, the photovoltaic cell connector 306 having a metal core 304 which is surrounded, descriptively sheathed, by a solder layer 308 (for example of soft solder material).

A soldering head 310 (for example implemented as holding-down device 310) for impressing a predetermined surface pattern into a surface of the photovoltaic cell connector 306 (for example into a surface of the solder layer 308) includes, according to various embodiments, a patterned but normally only passively movable bow 316, the bow 316 being patterned on its underside 312 (the side facing the photovoltaic cell connector 306), similar to the embodiments described above.

The soldering head 310 (designated as a photovoltaic cell connector forming and connecting device or as a forming and connecting tool) also includes soldering tips 314 attached above the patterned bow 316 and movable in the direction towards the patterned bow 316 and movable away from the top 312 of the patterned bow 316. Furthermore, the soldering head 310, in various embodiments, includes a plurality of holding-down devices 318 located above the patterned bow 316, attached to be movable in the direction towards the patterned bow 316 and to be movable away from the patterned bow 316, the holding-down devices 318 and the soldering tips 314, for example, being arranged next to one another, for example alternately next to one another.

FIG. 3B shows the photovoltaic cell 202 during its electrical bonding at a second time in a second representation 320.

As shown in FIG. 3B, the soldering tips 314 moved in the direction of the underside 312 of the patterned bow 316 press the movably attached patterned bow 316 and the photovoltaic cell connector 306 onto the photovoltaic cell 202 and the solder of the solder layer 308 is molten by means of the soldering tips 314 pressed down. In this context, the patterned underside 312 of the bow 316 is pressed into the molten solder of the solder layer 308 and the pattern is correspondingly transferred into the solder layer 308.

FIG. 3C shows the photovoltaic cell 202 during its electrical bonding at a third time in a third representation 330.

As shown in FIG. 3C, the soldering tips 314, after the melting of the solder, are detached again from the underside 312 of the bow 316, i.e. moved away from it and the holding-down devices 318 press the patterned bow 316 and the photovoltaic cell connector onto the photovoltaic cell 202 by a movement in the direction of the patterned bow 316 during the cooling of the solder. The holding-down devices 318 thus descriptively fix the combination until the solder has solidified and the soldering tips 314 are retracted only then. It should be noted that, in alternative embodiments, the holding-down devices 318 can also be moved already in the direction of the underside 312 of the bow 316 when the soldering tips 314 are still heating the solder.

FIG. 3D shows the photovoltaic cell 202 during its electrical bonding at a fourth time in a fourth representation 340.

As shown in FIG. 3D, the soldering head 310 then releases the combination of soldering strip and photovoltaic cell 202 in that, e.g., the holding-down devices 318 are moved away from the photovoltaic cell connector into their starting position or the entire soldering head 310 performs a corresponding movement. The surface of the solder layer 308 is thus patterned and the photovoltaic cell connector connected to the surface of the photovoltaic cell 202.

FIG. 4A to FIG. 4D show the impressing of the desired surface pattern into a cell connector (for example a wire) according to another embodiment.

In distinction from the embodiments described above, it is provided in various other embodiments that it is not the holding-down device which is patterned but the soldering is carried out on a suitably patterned support. During the soldering of the photovoltaic cells (e.g. solar cells), a suitably patterned conveyor belt or a solid support can be provided here. For this purpose, the photovoltaic cells should be placed emitter-(sun-)side downward onto the photovoltaic cell connectors. The heat for soldering can be input by contact soldering or any other soldering method.

By way of example, FIG. 4A shows for the purpose of explanation a photovoltaic cell 202 during its electrical bonding at a first time in a first representation 400. In this embodiment, contact soldering on a patterned support is provided.

In various embodiments, the surface 402 of the photovoltaic cell 202 (for example the sun side, emitter side) includes electrically conductive patterns (not shown in FIG. 4A), for example metallization lines and/or so-called busbars (for example including or consisting of Ag). Furthermore, a first photovoltaic cell connector 404 and a second photovoltaic cell connector 406 are shown in cross section, the photovoltaic cell connectors 404, 406 including a respective metal core 408, 410 which is surrounded, descriptively sheathed, by a respective solder layer 412, 414 (for example of soft solder material). As represented above, it is also shown in FIG. 4A that the emitter side 416 (in other words the sun side 416) of the photovoltaic cell 202 is aligned towards a patterned support 418 and is placed onto the latter and the first photovoltaic cell connector 404 provided between the patterned support 418 and the photovoltaic cell 402. The first photovoltaic cell connector 404 is arranged between the photovoltaic cell 202 and the patterned support 418 and the second photovoltaic cell connector 406 is arranged on the other side of the photovoltaic cell 202 between the photovoltaic cell 202 and a soldering head 420 described in greater detail still in the text which follows.

The patterned support 418 is correspondingly constructed in its pattern like the pattern of the patterned surface of the forming die which has been described above.

A photovoltaic cell connector forming device (for example implemented as holding-down device) for impressing a predetermined surface pattern into a surface of the first photovoltaic cell connector 404 (for example into a surface of the solder layer 412 of the first photovoltaic cell connector 404) includes, according to various embodiments, a soldering head 422 and a patterned support 418.

The soldering head 422 also includes soldering tips 424 attached to be movable towards the second photovoltaic cell connector 406 and to be movable away from the second photovoltaic cell connector 406. Furthermore, the soldering head 422 includes, in various embodiments, on its underside a plurality of holding-down devices 426 attached to be movable in the direction towards the second photovoltaic cell connector 406 and to be movable away from the second photovoltaic cell connector 406, the holding-down devices 426 and the soldering tips 424, for example, being arranged next to one another, for example alternately next to one another.

FIG. 4B shows the photovoltaic cell 202 during its electrical bonding at a second time in a second representation 430.

As shown in FIG. 4B, the soldering tips 424 moved in the direction of the photovoltaic cell 202 press the second photovoltaic cell connector 406, together with the photovoltaic cell 202 and the first photovoltaic cell connector 404, onto the patterned support 418 and the solder of the solder layer 412 of the first photovoltaic cell connector 404 and of the second photovoltaic cell connector 406 is molten by means of the soldering tips 424 pressed down. The patterned support 418 is pressed into the molten solder of the solder layer 412 of the first photovoltaic cell connector 404 and the pattern is correspondingly transferred into the solder layer 412 of the first photovoltaic cell connector 404.

FIG. 4C shows the photovoltaic cell 202 during its electrical bonding at a third time in a third representation 440.

As shown in FIG. 4C, the soldering tips 424, after the melting of the solder, are detached again from the surface of the second photovoltaic cell connector 406, i.e. moved away from it and the holding-down devices 426, by moving in the direction of the photovoltaic cell 202, press the photovoltaic cell 202 and the photovoltaic cell connectors 404 and 406 onto the patterned support 418 during the cooling of the solder. The holding-down devices 426 thus descriptively fix the combination until the solder has solidified and the soldering tips 424 are retracted only when the solder has sufficiently or completely solidified. It should be noted that in alternative embodiments, the holding-down devices 426 can also be moved already in the direction of the photovoltaic cell 202 when the soldering tips 424 are still heating up the solder.

FIG. 4D shows the photovoltaic cell 202 during its electrical bonding at a fourth time in a fourth representation 450.

As shown in FIG. 4D, the soldering head 420 then releases the combination of soldering ribbon and photovoltaic cell 202 and the surface of the solder layer 412 of the first photovoltaic cell connector 404 is patterned and the photovoltaic cell connectors 404 and 406 are connected to the photovoltaic cell 202. In various embodiments, a unit which, for example, connects a soldering tip, a holding-down device etc. functionally with one another is designated by the reference symbol 422.

FIG. 5A to FIG. 5C show the impressing of the desired surface pattern into a photovoltaic cell connector according to another embodiment.

By way of example, FIG. 5A shows for the purpose of explanation a photovoltaic cell 202 during its electrical bonding at a first time in a first representation 500. In this embodiment, the connection between photovoltaic cell 202 and photovoltaic cell connector 504 is provided through induction soldering by means of an induction soldering head 512 in which a forming die is implemented as patterned induction soldering holding-down device 514.

In various embodiments, the surface 502 of the photovoltaic cell 202 (for example the sun side) includes electrically conductive patterns (not shown in FIG. 5A), for example metallization lines and/or so-called busbars (for example including or consisting of Ag). Furthermore, a photovoltaic cell connector 504 is shown in cross section, the photovoltaic cell connector 504 including a metal core 506 which is surrounded, descriptively sheathed, by a solder layer 508 (for example of soft solder material).

A photovoltaic cell connector forming device 510 (for example implemented as induction soldering head 512 with patterned holding-down device 514) for impressing a predetermined surface pattern into a surface of the photovoltaic cell connector 504 (for example into a surface of the solder layer 508) has, according to various embodiments, an induction soldering head 512 with an induction soldering holding-down device 514 with patterned underside 516, the underside 516 (the side facing the photovoltaic cell connector 504) being patterned similar to the embodiments described above.

FIG. 5B shows the photovoltaic cell 202 during its electrical bonding at a second time in a second representation 520.

As shown in FIG. 5B, the induction soldering head 512 and the induction soldering holding-down device 514 then fix the photovoltaic cell connector 504 and the solder is inductively heated for a short time, melts and subsequently solidifies again, the induction soldering head 512 and the induction soldering holding-down device 514 keeping the photovoltaic cell connector 504 pressed down at least partially during the solidification.

FIG. 5C shows the photovoltaic cell 202 during its electrical bonding at a third time in a third representation 530.

As shown in FIG. 5C, the induction soldering head 512 then releases the combination of soldering ribbon and photovoltaic cell 202 and the surface 518 of the solder layer 508 is patterned and the photovoltaic cell connector 504 connected to the photovoltaic cell 202.

Figure 6:
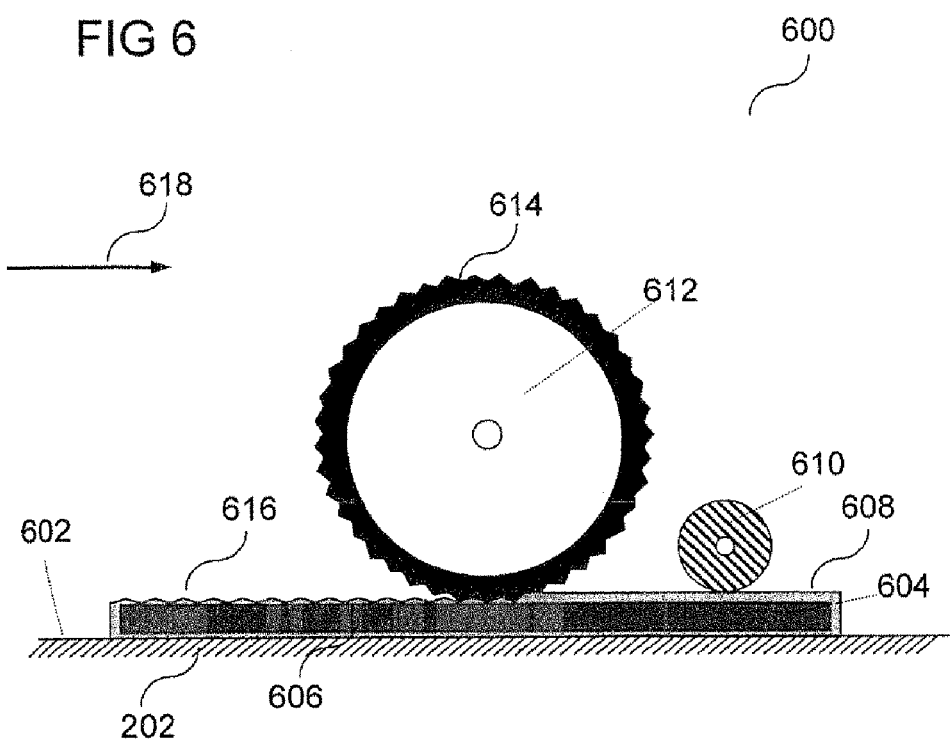
FIG. 6 shows the impressing of the desired surface pattern into a cell connector (for example a wire) according to one embodiment.

FIG. 6 shows the impressing of the desired surface pattern into a photovoltaic cell connector 604 according to another embodiment. In this embodiment, contact soldering with a patterned roller 612 as holding-down device is provided as will be explained in greater detail still in the text which follows.

In various embodiments, the surface 602 of the photovoltaic cell 202 (for example the sun side) includes electrically conductive patterns (not shown in FIG. 6), for example metallization lines and/or so-called busbars (for example including or consisting of Ag). Furthermore, a photovoltaic cell connector 604 is shown in cross section, the photovoltaic cell connector 604 including a metal core 606 which is surrounded, descriptively sheathed, by a solder layer 608 (for example of soft solder material).

In this embodiment, two rollers are provided, namely a first heated roller 610 which melts the solder of the solder layer 608 locally, and a second roller 612 which is constructed in the form of a patterned cooled roller 612 and includes along its circumference the pattern to be impressed into the molten solder or the pattern 614 inverse thereto. The second roller 612 is used as holding-down device and at the same time transfers its circumferential pattern into the molten solder layer 608 which solidifies due to the contact with the second roller 612 by which means a patterned surface 616 of the solder layer 608 is formed.

The direction of movement of the soldering roller 610 and the roller-shaped patterned holding-down device 612 is symbolized in FIG. 6 by means of an arrow 616.

The speed of the first roller 610 relative to the photovoltaic cell connector 604 is controlled in such a manner that the solder of the solder layer 608 is heated or molten to a sufficient extent. Furthermore, the speed of the second roller 612 relative to the photovoltaic cell connector 604 is controlled in such a manner that with the cooling temperature, provided in each case, of the second roller 612 the pattern in the solder has already sufficiently solidified when the circumferential pattern of the second roller 612 detaches itself again from the solder.

In an alternative embodiment, the photovoltaic cell 202 (for example the solar cell 202) with the photovoltaic cell connector 604 in place can also be moved through under the soldering roller 612 and the holding-down device 614.

According to various embodiments, a device for fixing a photovoltaic cell connector on a surface of a photovoltaic cell is thus provided. The device may include a positioning element for bringing the photovoltaic cell connector into contact with the surface of the photovoltaic cell; a heater for heating at least a part of the photovoltaic cell connector which is brought into contact with the surface of the photovoltaic cell; a forming die which includes a forming pattern for impressing a predetermined surface pattern into the heated surface of the photovoltaic cell connector so that a predetermined surface pattern is formed; and a controller which is arranged in such a manner that it drives the heater and the forming die in such a manner that the forming die is held at least partially in contact with the surface of the photovoltaic cell connector during the cooling of the photovoltaic cell connector so that the forming pattern is impressed into the surface of the photovoltaic cell connector by means of which the photovoltaic cell connector is fixed to the surface of the photovoltaic cell.

According to various embodiments, a method for fixing a photovoltaic cell connector on a surface of a photovoltaic cell is also provided.

According to one embodiment of the method, the method may include patterning of a surface of the heated part of the photovoltaic cell connector so that a predetermined surface pattern is formed.

In various embodiments, no additional method steps are needed during the soldering of photovoltaic cells (for example solar cells). Furthermore, the cost-effective conventional soldering strips may be used.

It was possible to show that the module efficiency can be increased up to $2\%_{rel}$ by means of patterned cell connectors according to one embodiment.

Various embodiments provide a method for thermally impressing the surface of solder-covered cell connectors in an arrangement of photovoltaic cells (for example solar cells).

In various embodiments, patterning of the solder is carried out by pressing a forming die into the molten solder and subsequent solidification in/under the die.

In various embodiments, the forming die is integrated into holding clamps.

In various embodiments, the impressing occurs during the bonding of the photovoltaic cells (for example solar cells).

In various embodiments, a method is provided in which the die consists of a thermally resistive material such as PTFE, ceramics etc. which cannot be wetted by the solder, or include such a material (for example on the surface).

In various embodiments, a method is provided in which the solder layer thickness is so great that the pattern to be impressed can be completely reproduced in the solder layer.

In various embodiments, a method is provided in which the pattern to be impressed is greater than the wavelength of the visible light.

In various embodiments, a method is provided in which the impressed pattern of the soldering strip reflects the light after encapsulation of the bonded solar cell, especially at the total reflection angle of the sun-side air/glass interface of the solar module, e.g. to active unshaded areas of the solar cell.

In various embodiments, advantages compared with other methods can consist in the simple feasibility directly as a part of the soldering process. Additional production and post-production steps can be bypassed or avoided, respectively. Only a modification of the soldering head or of the mechanical clamping of the component, respectively, is provided.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for patterning the surface of a solder-covered photovoltaic cell connector on the light-incidence side of a photovoltaic cell, the method comprising:

heating at least a part of the solder-covered photovoltaic cell connector which is in contact with the surface of the photovoltaic cell;

bonding the photovoltaic cell connector to contact areas of the photovoltaic cell;

patterning at least a part of the surface of the heated part of the solder-covered photovoltaic cell connector during said bonding so that a predetermined surface pattern is formed; and cooling the photovoltaic cell connector by means of which the pattern is fixed on the solder-covered surface of the photovoltaic cell connector, wherein the pattern is a trench pattern, wherein the surface of the cell connector is patterned in such a manner that incident light is reflected from the surface of the photovoltaic cell connector especially in such a manner that this leads to a total reflection at the glass/air interface of a photovoltaic module.

2. The method as claimed in claim 1, wherein the patterning takes place by means of a forming die which is impressed into the at least one part of the solder-covered surface of the photovoltaic cell connector.

3. The method as claimed in claim 2, wherein the forming die is impressed into the at least one part of the photovoltaic cell connector whilst the at least one part of the photovoltaic cell connector cools off.

4. The method as claimed in claim 1, wherein the electrical bonding takes place by means of a soldering process.

5. The method as claimed in claim 1, wherein the patterning takes place by means of pressing a forming die into the surface of the heated part of the photovoltaic cell connector.

6. The method as claimed in claim 1, wherein the layer thickness of the solder material forming a solder layer is at least so great that the forming pattern of the forming die is completely accommodated by the solder layer.

7. The method as claimed in claim 1, wherein the predetermined surface patterns are greater than the wavelength of the light converted into electric current by the photovoltaic cell.

* * * * *